United States Patent
Jogan et al.

(10) Patent No.: US 9,466,945 B2
(45) Date of Patent: Oct. 11, 2016

(54) SURFACE-EMITTING SEMICONDUCTOR LASER DEVICE AND METHOD FOR PRODUCING THE SAME

(71) Applicant: FUJI XEROX CO., LTD., Tokyo (JP)

(72) Inventors: Naoki Jogan, Kanagawa (JP); Jun Sakurai, Kanagawa (JP); Akemi Murakami, Kanagawa (JP); Takashi Kondo, Kanagawa (JP); Kazutaka Takeda, Kanagawa (JP); Junichiro Hayakawa, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/827,457

(22) Filed: Aug. 17, 2015

(65) Prior Publication Data
US 2016/0099549 A1  Apr. 7, 2016

(30) Foreign Application Priority Data
Oct. 3, 2014 (JP) .................... 2014-204613

(51) Int. Cl.
*H01S 5/00* (2006.01)
*H01S 5/187* (2006.01)
(Continued)

(52) U.S. Cl.
CPC .............. *H01S 5/187* (2013.01); *H01S 5/183* (2013.01); *H01S 5/18308* (2013.01); *H01S 5/18311* (2013.01); *H01S 5/18313* (2013.01);
(Continued)

(58) Field of Classification Search
CPC .... H01S 5/18358; H01S 5/183; H01S 5/187; H01S 5/18333; H01S 5/18322; H01S 5/18319; H01S 5/18311; H01S 5/18313; H01S 5/18308

USPC ................. 372/50.124, 45.01, 46.013, 50.11
See application file for complete search history.

(56) References Cited

U.S. PATENT DOCUMENTS

| 8,374,205 | B2* | 2/2013 | Matsuu | B82Y 20/00 |
| | | | | 372/107 |
| 2004/0213312 | A1* | 10/2004 | Tan | H01S 5/18358 |
| | | | | 372/46.01 |

(Continued)

FOREIGN PATENT DOCUMENTS

| JP | 2003-298186 A | 10/2003 |
| JP | 2004-327992 A | 11/2004 |

(Continued)

OTHER PUBLICATIONS

H. J. Unold et al., "Improving Single-Mode VCSEL Performance by Introducing a Long Monolithic Cavity", IEEE Photonics Technology Letters, Aug. 2000, vol. 12, No. 8.

(Continued)

*Primary Examiner* — Kinam Park
(74) *Attorney, Agent, or Firm* — Sughrue Mion, PLLC

(57) ABSTRACT

A surface-emitting semiconductor laser device includes a substrate and a semiconductor layer disposed on the substrate. The semiconductor layer includes a first semiconductor multilayer film of a first conductivity type, a first spacer layer, an active layer, a second spacer layer, and a second semiconductor multilayer film of a second conductivity type. The first semiconductor multilayer film and the second semiconductor multilayer film form a cavity. A peak of a pattern of a standing wave formed by the cavity and the center of the active layer are located at different positions.

7 Claims, 9 Drawing Sheets

(51) Int. Cl.
  *H01S 5/20* (2006.01)
  *H01S 5/343* (2006.01)
  *H01S 5/183* (2006.01)

(52) U.S. Cl.
  CPC ....... *H01S5/18319* (2013.01); *H01S 5/18322* (2013.01); *H01S 5/18327* (2013.01); *H01S 5/18333* (2013.01); *H01S 5/18358* (2013.01); *H01S 5/2027* (2013.01); *H01S 5/34313* (2013.01)

(56) References Cited

U.S. PATENT DOCUMENTS

| | | | |
|---|---|---|---|
| 2007/0153867 A1* | 7/2007 | Muller | B82Y 20/00 372/50.124 |
| 2008/0212631 A1* | 9/2008 | Takeuchi | B82Y 20/00 372/45.01 |
| 2010/0020835 A1* | 1/2010 | Anan | H01S 5/18308 372/45.01 |

FOREIGN PATENT DOCUMENTS

| | | |
|---|---|---|
| JP | 2007-158347 A | 6/2007 |
| JP | 2012-99647 A | 5/2012 |
| WO | 2008/078595 A1 | 7/2008 |

OTHER PUBLICATIONS

S. W. Z. Mahmoud et al., "Analysis of longitudinal mode wave guiding in vertical-cavity surface-emitting lasers with long monolithic cavity", Applied Physics Letters, Jan. 29, 2001, vol. 78, No. 5.

* cited by examiner

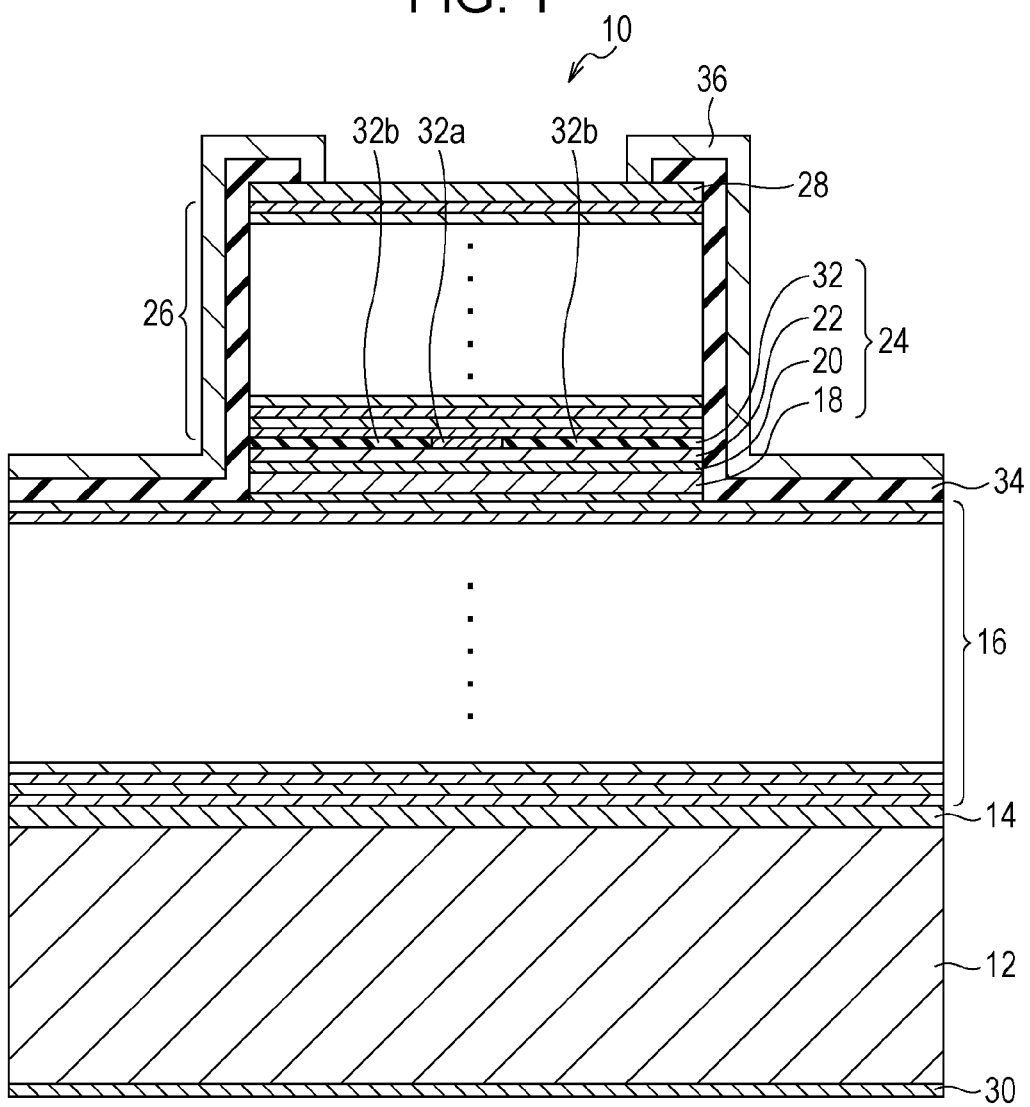

DIRECTION IN WHICH SEMICONDUCTOR LAYERS ARE STACKED

SURFACE-EMITTING SEMICONDUCTOR LASER DEVICE AND METHOD FOR PRODUCING THE SAME

CROSS-REFERENCE TO RELATED APPLICATIONS

This application is based on and claims priority under 35 USC 119 from Japanese Patent Application No. 2014-204613 filed Oct. 3, 2014.

BACKGROUND

Technical Field

The present invention relates to a surface-emitting semiconductor laser device and a method for producing the surface-emitting semiconductor laser device.

SUMMARY

According to an aspect of the invention, there is provided a surface-emitting semiconductor laser device including a substrate and a semiconductor layer disposed on the substrate. The semiconductor layer includes a first semiconductor multilayer film of a first conductivity type, a first spacer layer, an active layer, a second spacer layer, and a second semiconductor multilayer film of a second conductivity type. The first semiconductor multilayer film and the second semiconductor multilayer film form a cavity. A peak of a pattern of a standing wave formed by the cavity and the center of the active layer are located at different positions.

BRIEF DESCRIPTION OF THE DRAWINGS

Exemplary embodiments of the present invention will be described in detail based on the following figures, wherein:

FIG. 1 is a cross-sectional view of an example of a surface-emitting semiconductor laser device according to an exemplary embodiment;

DETAILED DESCRIPTION

Figure 2A:
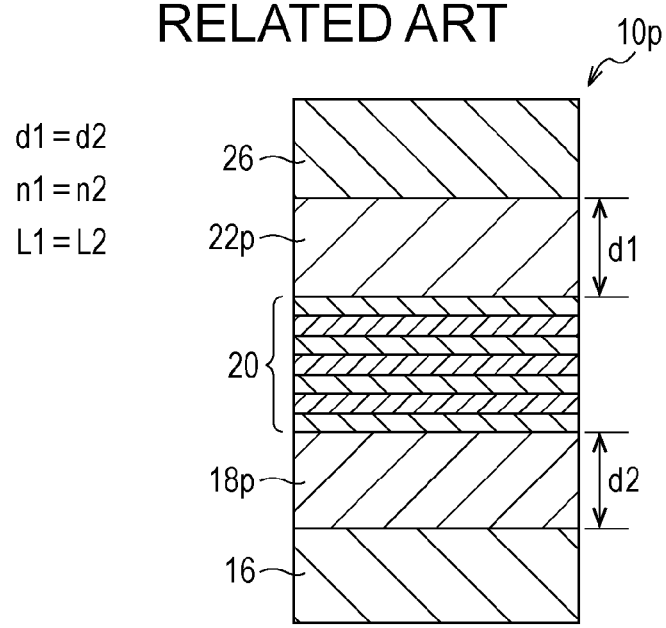
FIGS. 2A and 2B illustrate the positional relationship between a peak of the pattern of a standing wave and the center of an active layer in a surface-emitting semiconductor laser device according to the related art.

Exemplary embodiments of the present invention are described in detail below with reference to the attached drawings. An example of a surface-emitting semiconductor laser device 10 according to the exemplary embodiments is described below with reference to FIG. 1. FIG. 1 is a cross-sectional view of the surface-emitting semiconductor laser device 10 according to the exemplary embodiments. In the exemplary embodiments below, a GaAs-based surface-emitting semiconductor laser device including an n-type GaAs substrate is described as an example. However, the type of surface-emitting semiconductor laser device is not limited to this, and the technology according to the exemplary embodiments may be applied to surface-emitting semiconductor laser devices including an InGaAsP-based material, an AlGaInP-based material, an InGaN/GaN-based material, or the like. The type of substrate is not limited to n-type, and a p-type substrate may be used instead. In such a case, the term "n-type" in the following description should be read as "p-type".

As illustrated in FIG. 1, the surface-emitting semiconductor laser device 10 includes an n-type GaAs substrate 12, an n-type GaAs buffer layer 14, a lower distributed Bragg reflector (DBR) 16, an active region 24, an AlAs layer 32, an upper DBR 26, and a p-type GaAs contact layer 28 that are stacked on top of one another.

A silicon oxynitride film 34 serving as an inorganic insulating film is deposited on the periphery of the semiconductor layers including the mesa structure. A p-type electrode 36 is disposed on the p-type GaAs contact layer 28 with the silicon oxynitride film 34 interposed therebetween. The p-type electrode 36 is connected to the p-type GaAs contact layer 28 so as to come into ohmic contact with the p-type GaAs contact layer 28. The p-type electrode 36 is formed by, for example, depositing a titanium (Ti)/gold (Au) laminated film. An n-type electrode 30 is disposed on a surface of the n-type GaAs substrate 12 which is opposite to the surface on which the above-described semiconductor layers are stacked. The n-type electrode 30 is formed by, for example, depositing an AuGe (gold-germanium alloy)/Au laminated film.

In the exemplary embodiments, the n-type GaAs substrate 12 is a GaAs substrate doped with, for example, silicon (Si).

The n-type GaAs buffer layer 14 stacked on the n-type GaAs substrate 12 is composed of GaAs doped with, for example, Si and improves the crystallinity of the surface of the substrate that has been subjected to thermal cleaning.

The n-type lower DBR 16 stacked on the n-type GaAs buffer layer 14 is a multilayer film reflector including alternating pairs of semiconductor layers having different refractive indices. The thicknesses of the semiconductor layers are each set to $0.25\lambda/n$ where $\lambda$ represents the oscillation wavelength of the surface-emitting semiconductor laser device 10 and n represents the refractive index of the medium, that is, the semiconductor layer. Specifically, the lower DBR 16 includes alternating pairs of an n-type low-refractive-index layer composed of Si-doped $Al_{0.9}Ga_{0.1}As$ and an n-type high-refractive-index layer composed of Si-doped $Al_{0.3}Ga_{0.7}As$. In the exemplary embodiments below, the oscillation wavelength λ of the surface-emitting semiconductor laser device 10 is set to, for example, 780 nm.

In the exemplary embodiments, the active region 24 includes a lower spacer layer 18, a quantum well active layer 20, and an upper spacer layer 22. In the exemplary embodiments, the quantum well active layer 20 includes four barrier layers composed of $Al_{0.3}Ga_{0.7}As$ and three quantum well layers composed of $Al_{0.11}Ga_{0.89}As$ which are each interposed between the corresponding pair of the barrier layers. The lower spacer layer 18 is interposed between the quantum well active layer 20 and the lower DBR 16, and the upper spacer layer 22 is interposed between the quantum well active layer 20 and the upper DBR 26. The lower spacer layer 18 and the upper spacer layer 22 enable the length of the cavity described below to be controlled and also serve as cladding layers within which carriers are confined.

The p-type AlAs layer 32 stacked on the active region 24 serves as a current confinement layer and includes a current injection region 32a and a selective oxidation region 32b. A current that flows in the direction from the p-type electrode 36 to the n-type electrode 30 is concentrated by the current injection region 32a. Hereinafter, the diameter of the current injection region 32a may be referred to as "oxide confinement diameter".

The upper DBR 26 stacked on the AlAs layer 32 is a multilayer film reflector including alternating pairs of semiconductor layers having a thickness of $0.25\lambda/n$ and different refractive indices. Specifically, the upper DBR 26 includes alternating pairs of a p-type low-refractive-index layer composed of carbon (C)-doped $Al_{0.9}Ga_{0.1}As$ and a p-type high-refractive-index layer composed of C-doped $Al_{0.3}Ga_{0.7}As$.

Surface-emitting semiconductor laser devices such as the above-described one are capable of emitting a laser beam in a direction perpendicular to the substrate and can be readily formed in an array by two-dimensional integration. Therefore, the surface-emitting semiconductor laser devices are used as a light source for a writing unit of an electrophotographic system or a light source for optical communication.

The surface-emitting semiconductor laser devices include a pair of distributed Bragg reflectors (i.e., lower DBR 16 and upper DBR 26) that are stacked on a semiconductor substrate (i.e., n-type GaAs substrate 12) and an active layer (i.e., quantum well active layer 20) and cavity spacer layers (i.e., lower spacer layer 18 and upper spacer layer 22) that are interposed between the pair of distributed Bragg reflectors. When a current is injected into the active layer via electrodes (i.e., p-type electrode 36 and n-type electrode 30) disposed on the respective distributed Bragg reflectors, lasing oscillation occurs in a direction perpendicular to the substrate and the oscillated light is emitted from the upper portion of the surface-emitting semiconductor laser device (i.e., on a side of the surface-emitting semiconductor laser device on which the p-type GaAs contact layer 28 is disposed).

In order to lower the threshold current and control the transverse mode, the surface-emitting semiconductor laser devices include an oxide confinement layer (i.e., AlAs layer 32), which is formed by oxidizing an Al-containing semiconductor layer. When the Al-containing semiconductor layer is oxidized, the surface-emitting semiconductor laser device is formed into a mesa shape by etching and subsequently subjected to an oxidation treatment. Subsequently, the side surfaces of the mesa which are exposed by etching and the surface of the semiconductor that has been subjected to etching are commonly covered with an insulating material such as a silicon nitride (SiN) film, a silicon oxide ($SiO_2$) film, or a silicon oxynitride (SiON) film.

In particular, when the surface-emitting semiconductor laser devices are used for, for example, a raster output scanner (ROS, image-writing unit) of an electrophotographic system, controlling of spot size and the like are required. In such a case, it is desired that transverse-mode oscillation occurs such that the fundamental mode is predominant. While the transverse mode of the surface-emitting semiconductor laser devices has been commonly controlled by changing the oxide confinement diameter of the above-described current confinement layer, for example, the following methods have also been employed in order to operate the surface-emitting semiconductor laser devices predominantly in the fundamental mode: a method in which a mechanism that causes a loss of the higher mode is formed on the light-emitting surface; and a method in which the length of the cavity is increased. Although these methods are advantageous in controlling the fundamental mode, process-to-process variation is likely to occur and it is difficult to achieve high-yield production.

Accordingly, a crystal growth process that reduces the process-to-process variation is focused on in the exemplary embodiments below. Specifically, a crystal growth process in which a peak of the pattern of a standing wave formed by a cavity and the center of the active layer are located at different positions is employed. Hereinafter, when referring to the oscillation mode of the surface-emitting semiconductor laser device, the transverse mode is implied.

First Exemplary Embodiment

Before a surface-emitting semiconductor laser device 10a according to a first exemplary embodiment is described with reference to FIGS. 3A to 4C, the positional relationship between a peak of the pattern of a standing wave and the center of the active layer in a surface-emitting semiconductor laser device 10p according to the related art is described with reference to FIGS. 2A and 2B.

As illustrated in FIG. 2A, the surface-emitting semiconductor laser device 10p includes a lower DBR 16, a lower spacer layer 18p, a quantum well active layer 20, an upper spacer layer 22p, and an upper DBR 26. The physical thickness (i.e., thickness expressed in terms of actual distance) d1 of the upper spacer layer 22p is set to be equal to the physical thickness d2 of the lower spacer layer 18p (i.e., d1=d2). The refractive index n1 of the upper spacer layer 22p is set to be equal to the refractive index n2 of the lower spacer layer 18p (i.e., n1=n2). Thus, the optical thickness (i.e., thickness expressed in terms of optical distance, which is the product of the physical thickness and the refractive index of the medium, i.e., n1·d1) L1 of the upper spacer layer 22p is equal to the optical thickness L2 (i.e., n2·d2) of the lower spacer layer 18p (i.e., L1=L2).

Figure 2B:
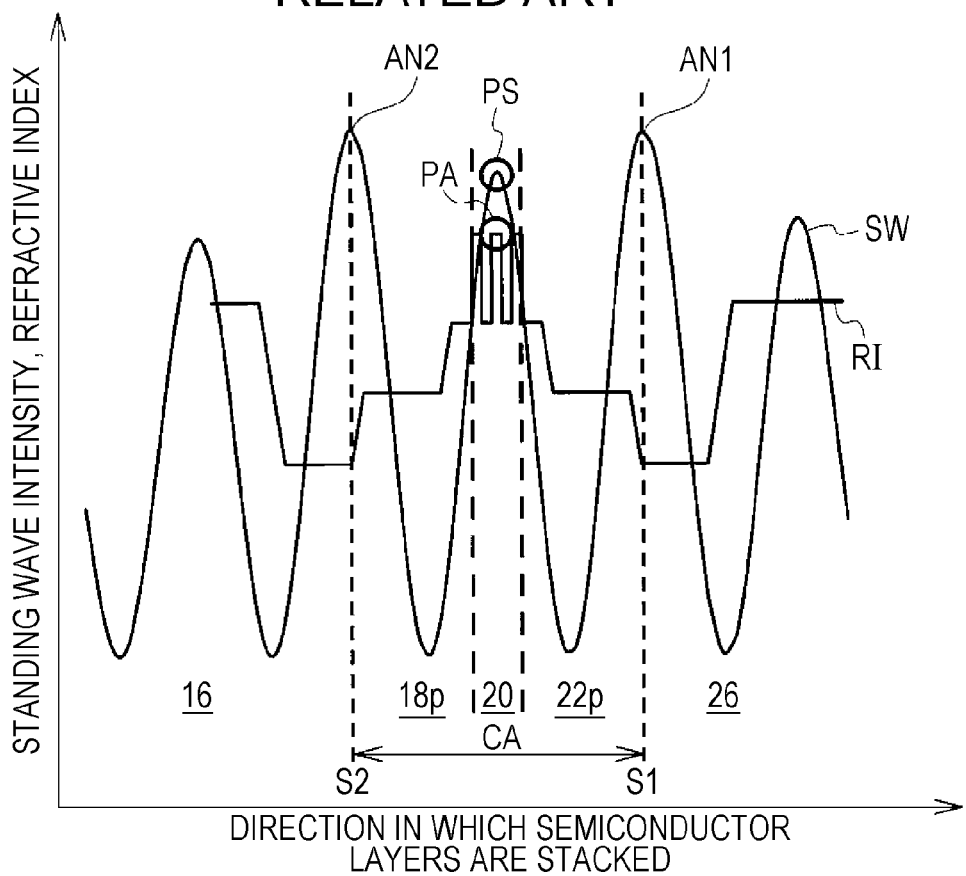

FIG. 2B is a graph illustrating the distributions of the intensity SW of a standing wave and refractive index RI in the surface-emitting semiconductor laser device 10p illustrated in FIG. 2A in the direction in which the semiconductor layers are stacked. The intensity SW of the standing wave is the square of electric field intensity. In the surface-emitting semiconductor laser device 10p, a cavity CA is formed by the interface S1 between the upper spacer layer 22p and the upper DBR 26 and the interface S2 between the lower spacer layer 18p and the lower DBR 16. A standing wave is formed inside the cavity CA such that antinodes (i.e., position at which the intensity SW of the standing wave peaks) AN1 and AN2 are located at the interfaces S1 and S2, respectively.

In the surface-emitting semiconductor laser device 10p, the optical thickness L1 of the upper spacer layer 22p is equal to the optical thickness L2 of the lower spacer layer 18p as illustrated in FIG. 2B. Thus, the position of the peak PS of the intensity SW of the standing wave is an agreement with the position of the center PA of the quantum well active layer 20.

Next, the positional relationship between a peak of the pattern of the standing wave and the center of the active layer in the surface-emitting semiconductor laser device 10a according to the first exemplary embodiment is described with reference to FIGS. 3A and 3B. Since the positional relationship among the interfaces S1 and S2, the cavity CA, and the antinodes AN1 and AN2 in FIG. 3B is the same as in FIG. 2B, illustration thereof is omitted.

Figure 3A:
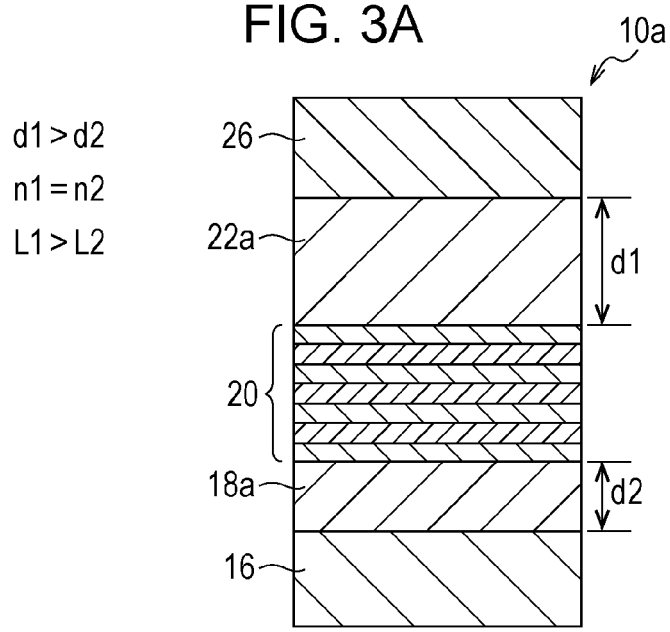
FIGS. 3A and 3B illustrate the positional relationship between a peak of the pattern of a standing wave and the center of a quantum well active layer in a surface-emitting semiconductor laser device according to a first exemplary embodiment.

In the surface-emitting semiconductor laser device 10a, the physical thickness d1 of the upper spacer layer 22a is set to be different from the physical thickness d2 of the lower spacer layer 18a (i.e., d1>d2) as illustrated in FIG. 3A. As a result, the optical thickness L1 of the upper spacer layer 22a and the optical thickness L2 of the lower spacer layer 18a are set to be different (i.e., L1>L2), that is, asymmetrical. The refractive index n1 of the upper spacer layer 22a is set to be equal to the refractive index n2 of the lower spacer layer 18a (i.e., n1=n2).

In the first exemplary embodiment, for example, the optical thickness L1 is set to be 10% larger than the optical thickness L2 by setting the physical thickness d1 of the upper spacer layer 22a to be larger than the physical thickness d2 of the lower spacer layer 18a. The difference in length is not limited to 10% and may be set appropriately depending on, for example, the desired light output intensity in the fundamental transverse mode. Hereinafter, a structure in which the optical thickness L1 of the upper spacer layer 22a is different from the optical thickness L2 of the lower spacer layer 18a may be referred to as "asymmetrical cavity structure".

Figure 3B:
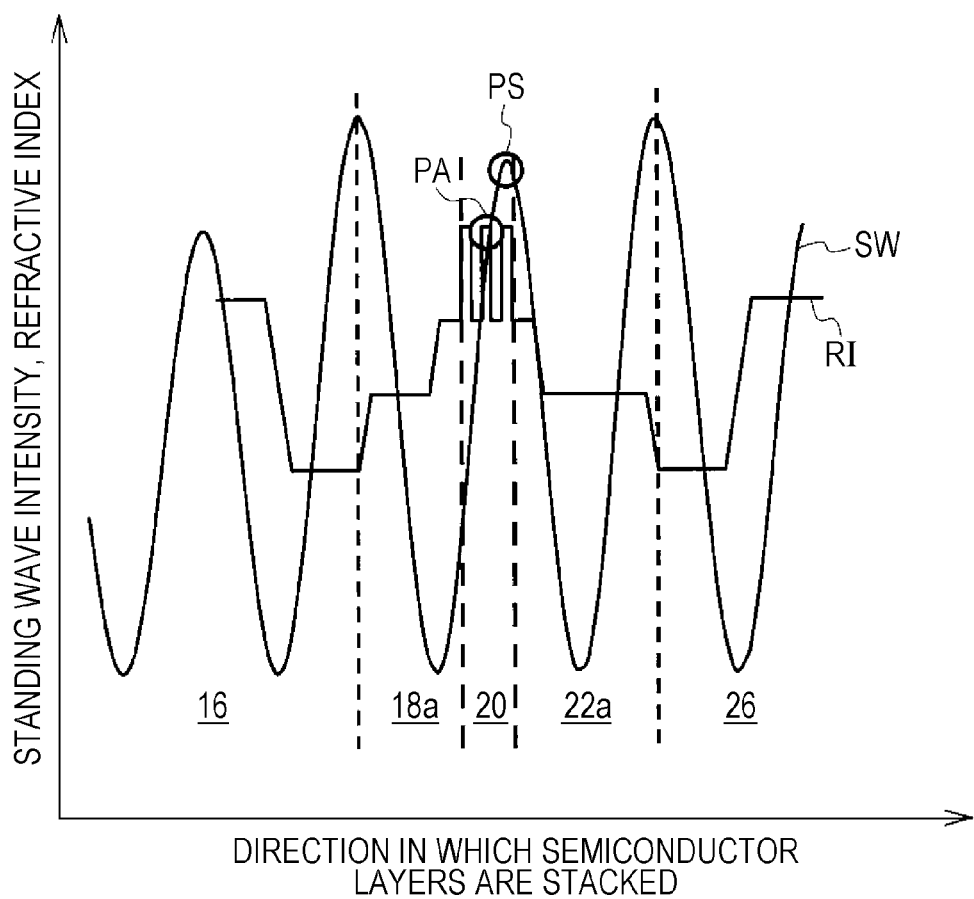

In the surface-emitting semiconductor laser device 10a, the position of the peak PS of the intensity SW of the standing wave is not in agreement with (i.e., is displaced from) the position of the center PA of the quantum well active layer 20 as illustrated in FIG. 3B because the optical thickness L1 of the upper spacer layer 22a is different from the optical thickness L2 of the lower spacer layer 18a. In the surface-emitting semiconductor laser device 10a, in which the optical thickness L1 of the upper spacer layer 22a is set to be larger than the optical thickness L2 of the lower spacer layer 18a, the position of the peak PS of the intensity SW of the standing wave is displaced from the position of the center PA of the quantum well active layer 20 toward the upper spacer layer 22a. It is needless to say that, conversely, setting the physical thickness d1 of the upper spacer layer 22a to be smaller than the physical thickness d2 of the lower spacer layer 18a causes the position of the peak PS of the intensity SW of the standing wave to be displaced from the position of the center PA of the quantum well active layer 20 toward the lower spacer layer 18a.

Locating the peak PS of the intensity SW of the standing wave and the center PA of the quantum well active layer 20 at different positions in the above-described manner enables the following effects to be produced. That is, when the peak PS of the intensity SW of the standing wave and the center PA of the quantum well active layer 20 are located at different positions, the light confinement effect is reduced but the difference in gain between the fundamental mode and the higher mode is increased. The difference in gain increases with an increase in the amount of displacement of the position of the peak PS of the intensity SW of the standing wave from the position of the center PA of the quantum well active layer 20. Thus, controlling the amount of displacement such that the fundamental-mode oscillation occurs but the higher-mode oscillation is suppressed by a considerable degree enables the surface-emitting semiconductor laser device 10a to oscillate predominantly in the fundamental mode.

Figure 4A:
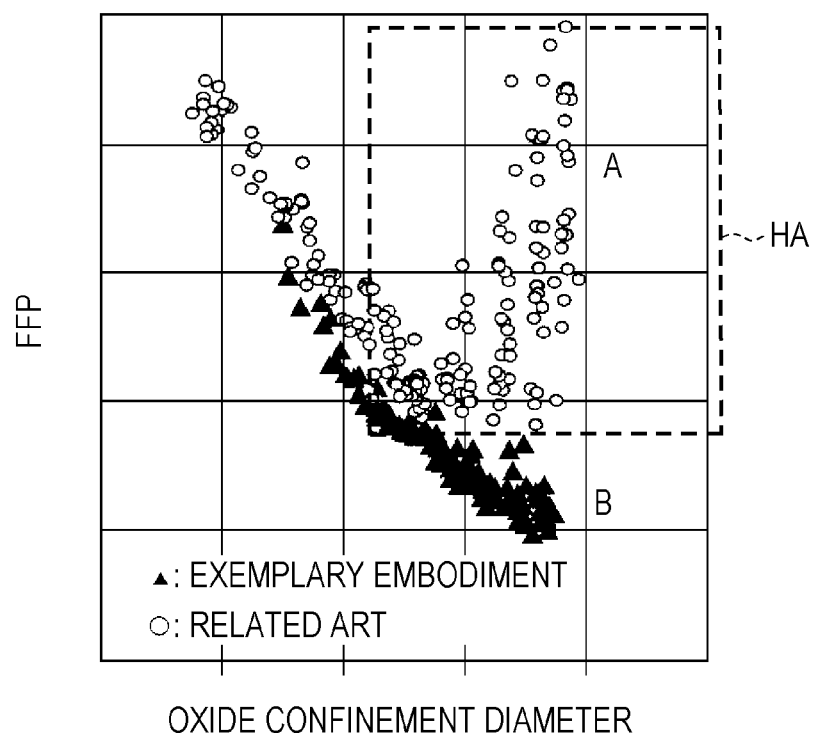
FIGS. 4A to 4C are graphs illustrating an example of the characteristics of a surface-emitting semiconductor laser device according to a first exemplary embodiment.

The characteristics of the above-described surface-emitting semiconductor laser device 10a are described with reference to FIGS. 4A to 4C. FIG. 4A is a graph illustrating the relationships between oxide confinement diameter and far field pattern (FFP) in the surface-emitting semiconductor laser device 10p according to the related art and the surface-emitting semiconductor laser device 10a according to the first exemplary embodiment, which are determined by actual measurement. FFP is a measure of horizontal and vertical distribution of light intensity measured at a considerable distance from the light-emitting surface of the laser and represented as the range of angles (unit: degree) at which the light intensity is reduced to half the maximum light intensity. The smaller the FFP, the smaller the spot size of light emitted from the surface-emitting semiconductor laser device 10a. In FIG. 4A, oxide confinement diameter is represented as the diameter of the current injection region 32a (unit: μm).

As illustrated in FIG. 4A, in the surface-emitting semiconductor laser device 10p according to the related art, FFP initially decreases with an increase in oxide confinement diameter and then starts increasing when oxide confinement diameter exceeds a specific value. Thus, the characteristic of FFP with respect to oxide confinement diameter in the surface-emitting semiconductor laser device 10p changes along a convex downward curve. In contrast, in the surface-emitting semiconductor laser device 10a according to the first exemplary embodiment, FFP keeps decreasing with an increase in oxide confinement diameter along a downward-sloping curve.

The difference in relationship between oxide confinement diameter and FFP between the surface-emitting semiconductor laser device 10a and the surface-emitting semiconductor laser device 10p is made because the surface-emitting semiconductor laser device 10a keeps oscillating predominantly in the fundamental mode even when oxide confinement diameter is increased, while the surface-emitting semiconductor laser device 10p starts oscillating both in the fundamental mode and in the higher mode when oxide confinement diameter exceeds the specific value. In FIG. 4A, the region in which the proportion of the higher-mode oscillation of the surface-emitting semiconductor laser device 10p is high is denoted by a higher-mode occurrence region "HA".

Figure 4B:
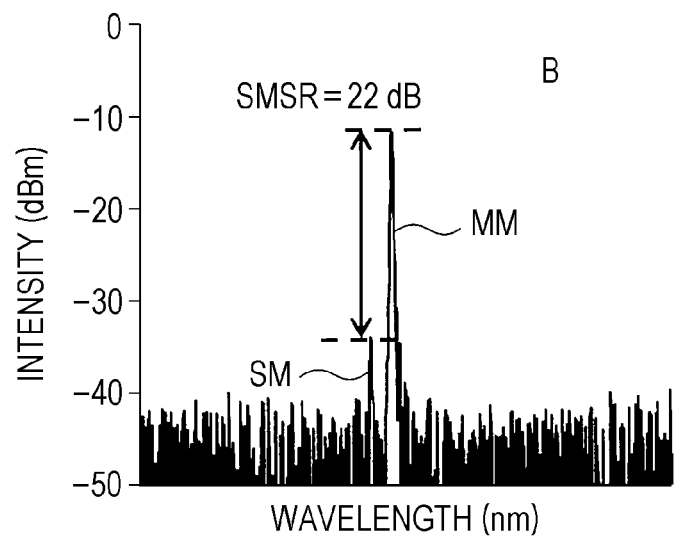
Figure 4C:
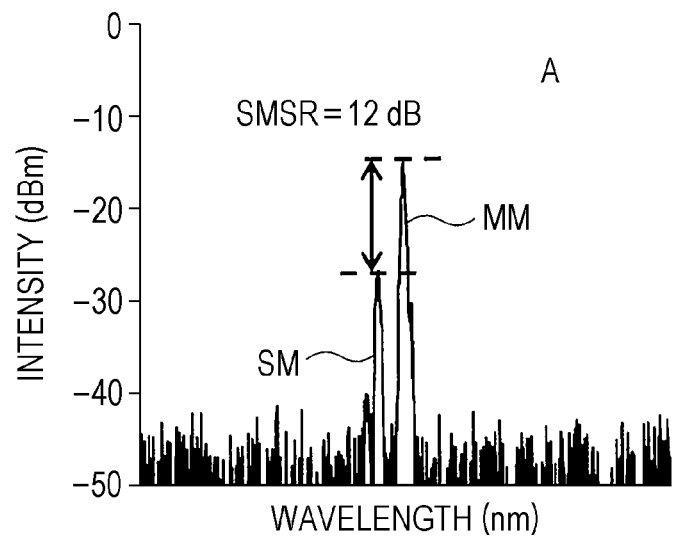

FIGS. 4B and 4C show the data that confirm the above-described difference in oscillation mode between the surface-emitting semiconductor laser device 10a and the surface-emitting semiconductor laser device 10p. That is, FIG. 4B illustrates the spectrum of light emitted from the surface-emitting semiconductor laser device 10a according to the first exemplary embodiment, and FIG. 4C illustrates the spectrum of light emitted from the surface-emitting semiconductor laser device 10p according to the related art. FIGS. 4B and 4C show the data corresponding to the samples taken at the positions denoted by "B" and "A", respectively, in FIG. 4A.

As illustrated in FIGS. 4B and 4C, a main mode MM and a side mode SM are present both in the spectrum of light emitted from the surface-emitting semiconductor laser device 10a and in the spectrum of light emitted from the surface-emitting semiconductor laser device 10p. The main mode MM is a mode resulting from the fundamental-mode oscillation, and the side mode SM is a mode resulting from the higher-mode oscillation.

The side mode SM occurs both in the surface-emitting semiconductor laser device 10p and in the surface-emitting semiconductor laser device 10a. However, the side mode suppression ratio (SMSR, which is a measure of the difference in peak intensity between the main mode MM and the side mode SM) of the surface-emitting semiconductor laser device 10p is 12 dB, while the SMSR of the surface-emitting semiconductor laser device 10a is 22 dB, that is, higher than that of the surface-emitting semiconductor laser device 10p by 10 dB. In other words, the intensity of the higher mode in the surface-emitting semiconductor laser device 10a is reduced to one tenth of that in the surface-emitting semiconductor laser device 10p. These data show that locating the peak PS of the intensity SW of the standing wave and the center PA of the quantum well active layer 20 at different positions increases the intensity of fundamental-transverse-mode light output of the surface-emitting semiconductor laser device.

Second Exemplary Embodiment

A surface-emitting semiconductor laser device 10b according to the second exemplary embodiment is described below with reference to FIGS. 5A and 5B. In the surface-emitting semiconductor laser device 10b, the optical film thicknesses of the upper spacer layer 22b and the lower spacer layer 18b are set to be asymmetrical by varying the refractive index between the upper spacer layer 22b and the lower spacer layer 18b.

Figure 5A:
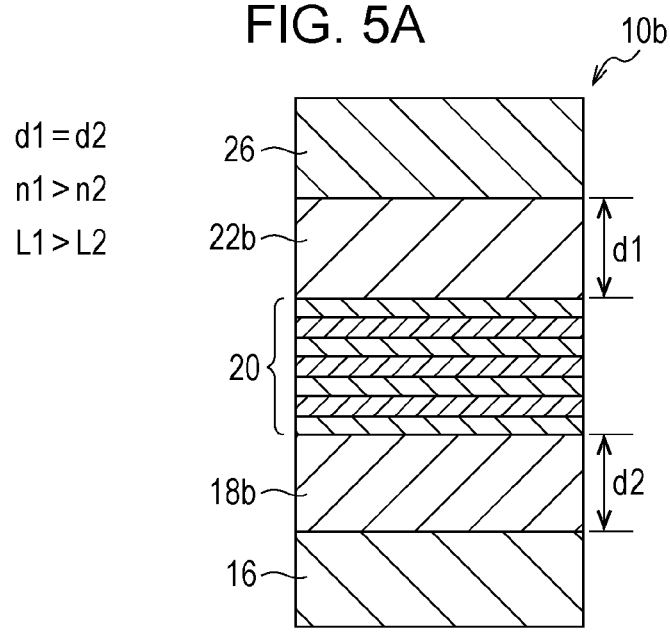
FIGS. 5A and 5B illustrate the positional relationship between a peak of the pattern of a standing wave and the center of a quantum well active layer in a surface-emitting semiconductor laser device according to a second exemplary embodiment.
Figure 5B:
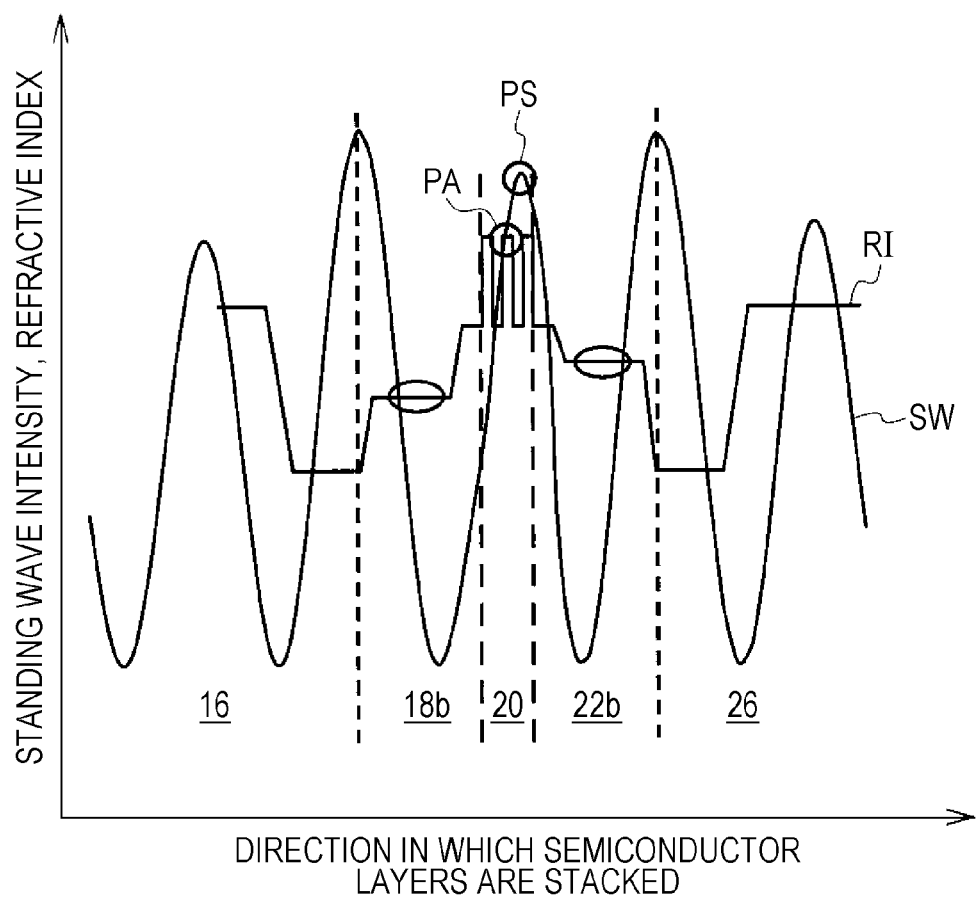

As illustrated in FIG. 5A, in the surface-emitting semiconductor laser device 10b, while the physical thickness d1 of the upper spacer layer 22b is set to be equal to the physical thickness d2 of the lower spacer layer 18b (i.e., d1=d2), the refractive index n1 of the upper spacer layer 22b is set to be higher than the refractive index n2 of the lower spacer layer 18b (i.e., n1>n2). Thus, the optical thickness L1 of the upper spacer layer 22b is set to be larger than the optical thickness L2 of the lower spacer layer 18b (i.e., L1>L2). As a result, the position of the peak PS of the intensity SW of the standing wave is displaced from the position of the center PA of the quantum well active layer 20 toward the upper spacer layer 22b.

As described above, it is possible to set the optical thickness L1 of the upper spacer layer 22b to be different from the optical thickness L2 of the lower spacer layer 18b by varying the refractive index between the upper spacer layer 22b and the lower spacer layer 18b while setting the physical thickness d1 of the upper spacer layer 22b to be equal to the physical thickness d2 of the lower spacer layer 18b. That is, setting the refractive index n1 of the upper spacer layer 22b to be different from the refractive index n2 of the lower spacer layer 18b also causes the peak PS of the intensity SW of the standing wave and the center PA of the quantum well active layer 20 to be located at different positions. Whether physical thickness is varied or refractive index is varied between the upper spacer layer 22b and the lower spacer layer 18b in order to locate the peak PS of the intensity SW of the standing wave and the center PA of the quantum well active layer 20 at different positions may be determined in consideration of the production conditions and the like.

Third Exemplary Embodiment

A surface-emitting semiconductor laser device 10c according to the third exemplary embodiment is described below with reference to FIGS. 6A and 6B. In the surface-emitting semiconductor laser device 10c, both physical thickness and refractive index are varied between the upper spacer layer 22c and the lower spacer layer 18c in order to set the optical thicknesses of the upper spacer layer 22c and the lower spacer layer 18c to be asymmetrical.

Figure 6A:
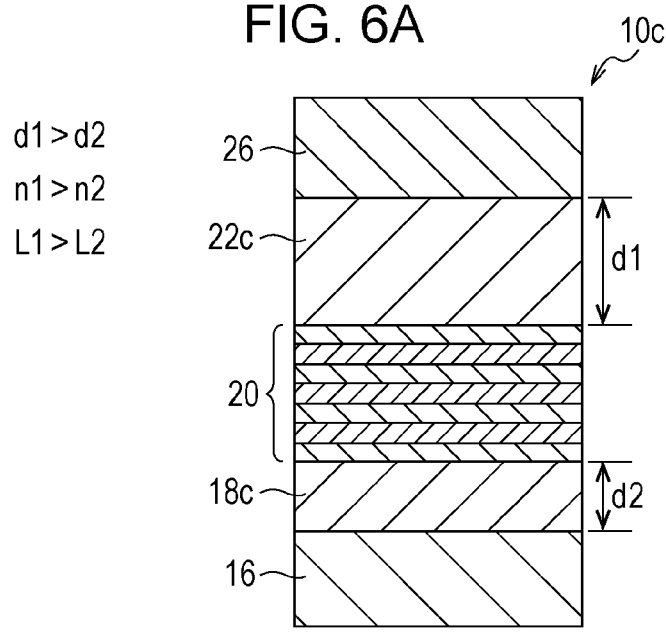
FIGS. 6A and 6B illustrate the positional relationship between a peak of the pattern of a standing wave and the center of a quantum well active layer in a surface-emitting semiconductor laser device according to a third exemplary embodiment.
Figure 6B:
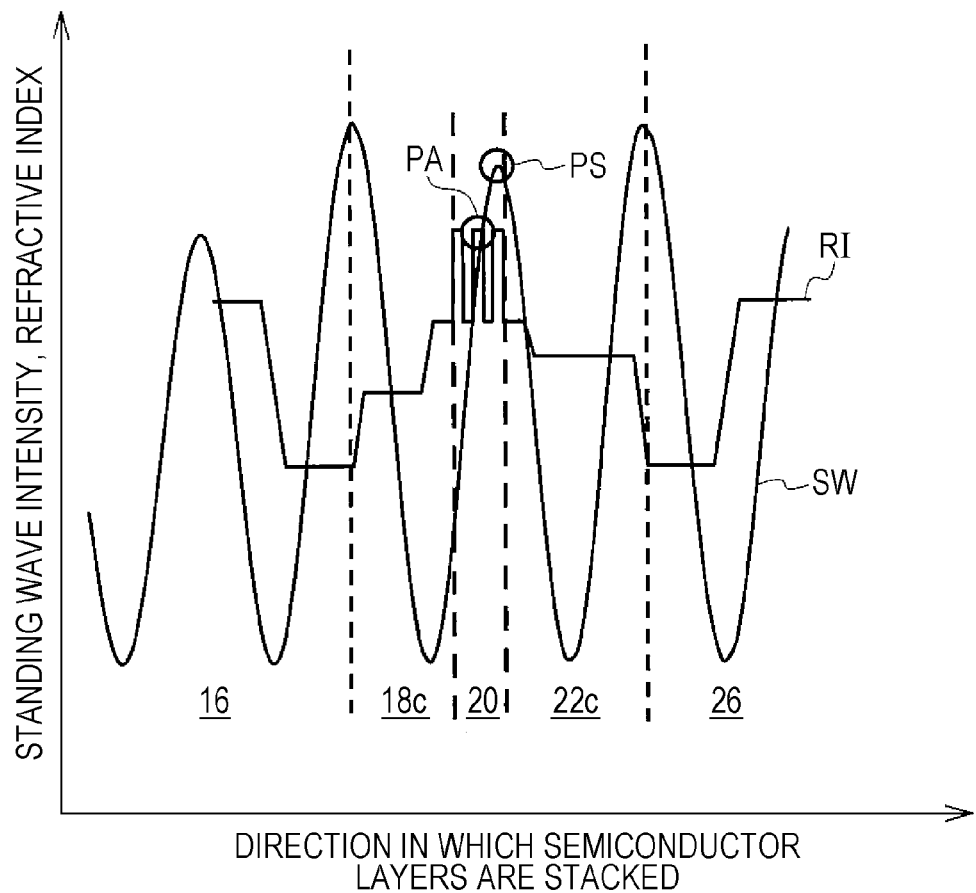

As illustrated in FIG. 6A, in the surface-emitting semiconductor laser device 10c, the physical thickness d1 of the upper spacer layer 22c is set to be larger than the physical thickness d2 of the lower spacer layer 18c (i.e., d1>d2) and the refractive index n1 of the upper spacer layer 22c is set to be higher than the refractive index n2 of the lower spacer layer 18c (i.e., n1>n2). As a result, the optical thickness L1 of the upper spacer layer 22c is set to be larger than the optical thickness L2 of the lower spacer layer 18c (i.e., L1>L2).

In the third exemplary embodiment, since physical thicknesses and refractive indices are set in the above-described manner, the position of the peak PS of the intensity SW of the standing wave is displaced from the position of the center PA of the quantum well active layer 20 toward the upper spacer layer 22c.

As described above, varying both physical thickness and refractive index between the upper spacer layer 22c and the lower spacer layer 18c, that is, setting the physical thickness d1 of the upper spacer layer 22c to be different from the physical thickness d2 of the lower spacer layer 18c and setting the refractive index n1 of the upper spacer layer 22c to be different from the refractive index n2 of the lower spacer layer 18c, also causes the optical thickness L1 of the upper spacer layer 22c to be different from the optical thickness L2 of the lower spacer layer 18c. That is, setting the physical thickness d1 of the upper spacer layer 22c to be different from the physical thickness d2 of the lower spacer layer 18c and setting the refractive index n1 of the upper spacer layer 22c to be different from the refractive index n2 of the lower spacer layer 18c also cause the peak PS of the intensity SW of the standing wave and the center PA of the quantum well active layer 20 to be located at different positions.

In the third exemplary embodiment, both physical thickness and refractive index are controlled in order to locate the peak PS of the intensity SW of the standing wave and the center PA of the quantum well active layer 20 at different positions. This method may be effective, for example, in the case where the amount of displacement of the position of the peak PS of the intensity SW of the standing wave from the position of the center PA of the quantum well active layer 20 is desired to be increased.

In the third exemplary embodiment, an example case where the direction in which the position of the peak PS is displaced due to the change in physical thickness is the same as the direction in which the position of the peak PS is displaced due to the change in refractive index is described. However, these directions are not necessarily the same. That is, for example, the peak PS of the intensity SW of the standing wave may be displaced toward the upper spacer layer 22c by setting the physical thickness d1 of the upper spacer layer 22c to be larger than the physical thickness d2 of the lower spacer layer 18c while the peak PS of the intensity SW of the standing wave is displaced toward the lower spacer layer 18c by setting the refractive index n2 of the lower spacer layer 18c to be higher than the refractive index n1 of the upper spacer layer 22c. The direction in which the peak PS is displaced in the end may be determined by controlling the absolute value of the amount of displacement due to the change in physical thickness and the absolute value of the amount of displacement due to the change in refractive index.

The above-described method in which two approaches in which the peak PS of the intensity SW of the standing wave is displaced from the position of the center PA of the quantum well active layer 20 in opposite directions is suitably employed, for example, in the case where the position of the peak PS of the intensity SW of the standing wave relative to the position of the center PA of the quantum well active layer 20 is desired to be controlled with accuracy in the production process.

Fourth Exemplary Embodiment

A surface-emitting semiconductor laser device 10d according to the fourth exemplary embodiment is described below with reference to FIGS. 7A and 7B. In the surface-emitting semiconductor laser device 10d, both physical thickness and refractive index are varied between the upper spacer layer 22d and the lower spacer layer 18d in order to set the optical thicknesses of the upper spacer layer 22d and the lower spacer layer 18d to be asymmetrical as in the surface-emitting semiconductor laser device 10c. However, in the surface-emitting semiconductor laser device 10d, the physical thicknesses and the refractive indices of the upper spacer layer 22d and the lower spacer layer 18d are set in a manner opposite to that in the surface-emitting semiconductor laser device 10c.

Figure 7A:
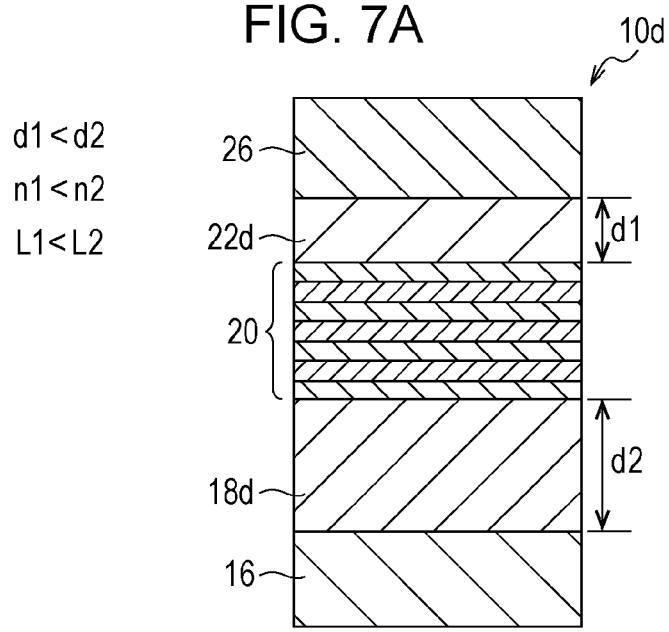
FIGS. 7A and 7B illustrate the positional relationship between a peak of the pattern of a standing wave and the center of a quantum well active layer in a surface-emitting semiconductor laser device according to a fourth exemplary embodiment.
Figure 7B:
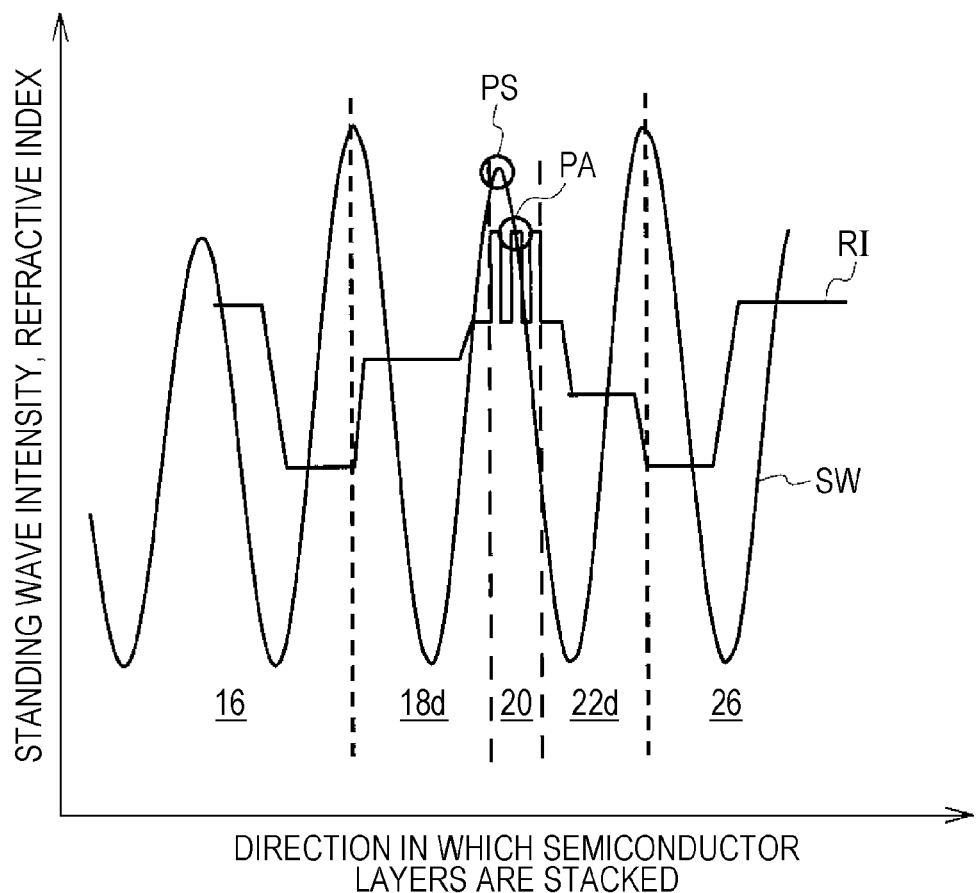

Specifically, in the surface-emitting semiconductor laser device 10d, the physical thickness d2 of the lower spacer layer 18d is set to be larger than the physical thickness d1 of the upper spacer layer 22d (i.e., d1<d2) and the refractive index n2 of the lower spacer layer 18d is set to be higher than the refractive index n1 of the upper spacer layer 22d (i.e., n1<n2) as illustrated in FIG. 7A.

In the fourth exemplary embodiment, since physical thicknesses and refractive indices are set in the above-described manner, the position of the peak PS of the intensity SW of the standing wave is displaced from the position of the center PA of the quantum well active layer 20 toward the lower spacer layer 18d.

Thus, physical thicknesses and refractive indices may be set by controlling the physical thickness and refractive index of the upper spacer layer 22 or by controlling the physical thickness and refractive index of the lower spacer layer 18. That is, any of the optical thickness of the upper spacer layer 22 and the optical thickness of the lower spacer layer 18 may be set to be larger or smaller than the standard optical thickness. The operation and the advantageous effect of the surface-emitting semiconductor laser device 10d according to the fourth exemplary embodiment are similar to those of the surface-emitting semiconductor laser device 10c described above, and therefore the descriptions thereof are omitted.

A method for producing the surface-emitting semiconductor laser device 10 according to the above-described embodiments is described below with reference to FIGS. 8A to 8D.

Figure 8A:
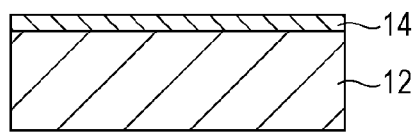
FIGS. 8A to 8D are cross-sectional views of a surface-emitting semiconductor laser device according to an exemplary embodiment, illustrating an example method for producing the surface-emitting semiconductor laser device.

An n-type GaAs buffer layer 14 having a carrier concentration of $2 \times 10^{18}$ cm$^{-3}$ and a thickness of about 500 nm is stacked on an n-type GaAs substrate 12 by metal-organic chemical vapor deposition (MOCVD) as illustrated in FIG. 8A.

Figure 8B:
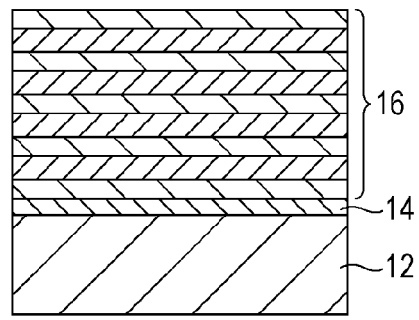

Subsequently, 37.5 periods of alternating pairs of an $Al_{0.3}Ga_{0.7}As$ layer and an $Al_{0.9}Ga_{0.1}As$ layer are stacked on the n-type GaAs buffer layer 14 as illustrated in FIG. 8B to form an n-type lower DBR 16. The thicknesses of the $Al_{0.3}Ga_{0.7}As$ layer and the $Al_{0.9}Ga_{0.1}As$ layer are each set to be equal to a quarter of to the wavelength $\lambda/n$ in the medium. The carrier concentrations in the $Al_{0.3}Ga_{0.7}As$ layer and the $Al_{0.9}Ga_{0.1}As$ layer are each set to about $2 \times 10^{18}$ cm$^{-3}$. The overall thickness of the lower DBR 16 is set to about 4 µm.

Figure 8C:
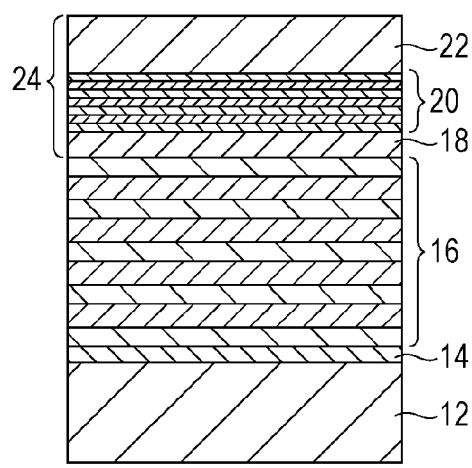

An active region 24 including a nondoped $Al_{0.6}Ga_{0.4}As$ layer serving as a lower spacer layer 18, a nondoped quantum well active layer 20, and a nondoped $Al_{0.6}Ga_{0.4}As$ layer serving as an upper spacer layer 22 is formed on the lower DBR 16 as illustrated in FIG. 8C. The quantum well active layer 20 includes four barrier layers composed of $Al_{0.3}Ga_{0.7}As$ and three quantum well layers composed of $Al_{0.11}Ga_{0.89}As$ which are each interposed between the corresponding pair of the barrier layers. The thicknesses of the $Al_{0.3}Ga_{0.7}As$ barrier layers are each set to about 5 nm. The thicknesses of the $Al_{0.11}Ga_{0.89}As$ quantum well layers are each set to about 9 nm. The overall thickness of the active region 24 is set to be equal to the wavelength $\lambda/n$ in the medium.

Figure 8D:
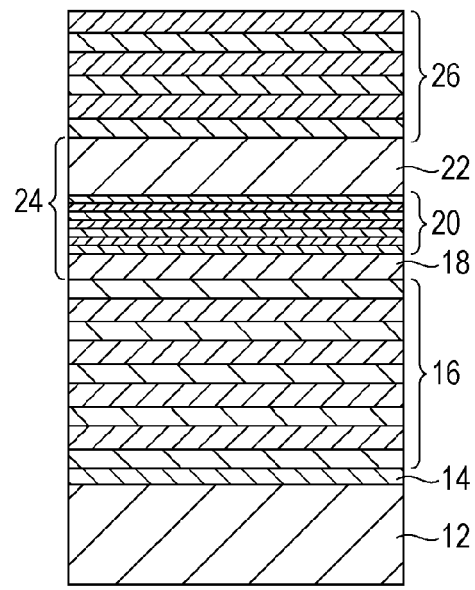

A p-type AlAs layer (not illustrated in the drawing) is formed on the upper spacer layer 22. Subsequently, 25 periods of alternating pairs of an $Al_{0.3}Ga_{0.7}As$ layer and an $Al_{0.9}Ga_{0.1}As$ layer are stacked on the AlAs layer as illustrated in FIG. 8D to form a p-type upper DBR 26. The thicknesses of the $Al_{0.3}Ga_{0.7}As$ layer and the $Al_{0.9}Ga_{0.1}As$ layer are each set to be equal to a quarter of the wavelength $\lambda/n$ in the medium. The carrier concentrations in the $Al_{0.3}Ga_{0.7}As$ layer and the $Al_{0.9}Ga_{0.1}As$ layer are each set to about $2 \times 10^{18}$ cm$^{-3}$. The overall thickness of the upper DBR 26 is set to about 3 µm. A p-type GaAs contact layer (not illustrated in the drawing) having a carrier concentration of about $1 \times 10^{19}$ cm$^{-3}$ and a thickness of about 10 nm is formed on the upper DBR 26.

Examples of materials used in this production method include trimethylgallium, trimethylaluminium, and arsine. An example of n-type dopants used in this production method is disilane. An example of p-type dopants used in this production method is carbon tetrabromide. The substrate temperature is set to about 700° C. during growth. Growth is continuously performed under a reduced pressure while different materials are successively charged. Optionally, a composition-gradient region having a thickness of about 20 nm in which the Al content is gradually changed may be interposed between each pair of the layers constituting the lower DBR or the upper DBR in order to reduce the electric resistance of the lower DBR or the upper DBR.

A method for producing an asymmetrical cavity structure in which the lower spacer layer 18 and the upper spacer layer 22 have different optical thicknesses is described below.

In the case where the physical thicknesses of the lower spacer layer 18 and the upper spacer layer 22 are set to be asymmetrical, thicknesses of the lower spacer layer 18 and the upper spacer layer 22 are set to be asymmetrical by varying the growth time (i.e., growth rate) between the nondoped $Al_{0.6}Ga_{0.4}As$ lower spacer layer 18 and the nondoped $Al_{0.6}Ga_{0.4}As$ upper spacer layer 22. For example, in production of the surface-emitting semiconductor laser device 10a (first exemplary embodiment), the growth time of the upper spacer layer 22 is set to be 10% longer than the growth time of the lower spacer layer 18. The molar ratio between the flow rate of trimethylaluminium and the flow rate of trimethylgallium which are used in the growth of lower spacer layer 18 is the same as in the growth of the upper spacer layer 22.

In the case where the optical thicknesses of the lower spacer layer 18 and the upper spacer layer 22 are set to be asymmetrical by varying the refractive index between the lower spacer layer 18 and the upper spacer layer 22, the refractive index is varied by varying the molar ratio between the flow rate of trimethylgallium and the flow rate of trimethylaluminium (i.e., compositional ratio between trimethylgallium and trimethylaluminium) between the growth of the lower spacer layer 18 and the growth of the upper spacer layer 22. The growth time for the lower spacer layer 18 is set to be equal to that for the upper spacer layer 22. For example, the composition of the lower spacer layer 18 is controlled to be $Al_{0.6}Ga_{0.4}As$ and the composition of the upper spacer layer 22 is controlled to be $Al_{0.55}Ga_{0.45}As$. In this case, the molar ratio between the flow rate of trimethylaluminium and the flow rate of the trimethylgallium is set to 60% in the growth of the lower spacer layer 18 and is set to 55% in the growth of the upper spacer layer 22.

In the case where the optical thicknesses of the lower spacer layer 18 and the upper spacer layer 22 are set to be asymmetrical by varying both physical thickness and refractive index between the lower spacer layer 18 and the upper spacer layer 22, the above-described method in which the optical thicknesses of the lower spacer layer 18 and the upper spacer layer 22 are set to be asymmetrical by varying physical thickness and the above-described method in which the optical thicknesses of the lower spacer layer 18 and the upper spacer layer 22 are set to be asymmetrical by varying refractive index are used in combination. That is, growth time is varied between the lower spacer layer 18 and the upper spacer layer 22, and the molar ratio between the flow rate of trimethylgallium and the flow rate of trimethylaluminium (i.e., compositional ratio between trimethylgallium and trimethylaluminium) is varied between the growth of the lower spacer layer 18 and the growth of the upper spacer layer 22.

In the production of the surface-emitting semiconductor laser device 10, in general, production error, that is, a difference between the predetermined thickness to which the layer is to be formed and the actual thickness of the layer, occurs. The production error may also occur in the above-described production method when the upper spacer layer 22 and the lower spacer layer 18 are formed. It is considered that the position of the peak PS of the intensity SW of the standing wave may deviate from the position of the center PA of the quantum well active layer 20 due to the production error.

However, it has been confirmed that the production error that may occur in the formation of the upper spacer layer 22, the lower spacer layer 18, and the like in the above-described production method is less than 1% in terms of optical thickness and that it is difficult to cause the surface-emitting semiconductor laser device 10 to oscillate predominantly in the fundamental mode when the amount of deviation is at this level. Thus, in the above-described exemplary embodiments, the optical thicknesses of the upper spacer layer 22 and the lower spacer layer 18 are set such that the optical thickness varies at least 1% or at least about 1% between the upper spacer layer 22 and the lower spacer layer 18.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface-emitting semiconductor laser device comprising:
    a substrate; and
    a semiconductor layer disposed on the substrate, the semiconductor layer including:
        a first semiconductor multilayer film of a first conductivity type;
        a first spacer layer;
        an active layer;
        a second spacer layer; and
        a second semiconductor multilayer film of a second conductivity type,
    wherein the first semiconductor multilayer film and the second semiconductor multilayer film form a cavity,
    wherein the cavity is configured to form a pattern of a standing wave,
    wherein a closest peak to a center of the active layer, from among peaks of the pattern of the standing wave, is located at position different from the center of the active layer.

2. The surface-emitting semiconductor laser device according to claim 1,
    wherein the closest peak of the pattern of the standing wave formed by the cavity is located at the position different from the center of the active layer because the first spacer layer and the second spacer layer have different optical thicknesses.

3. The surface-emitting semiconductor laser device according to claim 2,
    wherein the first spacer layer and the second spacer layer have different optical thicknesses because of at least one of the following reasons:
        the first spacer layer and the second spacer layer have different physical thicknesses; and
        the first spacer layer and the second spacer layer have different refractive indices.

4. The surface-emitting semiconductor laser device according to claim 2,
    wherein a ratio between the optical thickness of the first spacer layer and the optical thickness of the second spacer layer is about 0.99 or less or about 1.01 or more.

5. The surface-emitting semiconductor laser device according to claim 1,
    wherein the closest peak of the pattern of the standing wave formed by the cavity is located at the position different from the center of the active layer because the closest peak of the pattern of the standing wave formed by the cavity is displaced from the center of the active layer such that fundamental transverse mode oscillation occurs.

6. The surface-emitting semiconductor laser device according to claim 1,
wherein any one of:
an optical thickness of a portion extending from the center of the active layer to an interface between the first semiconductor multilayer film and the first spacer layer, and
an optical thickness of a portion extending from the center of the active layer to an interface between the second semiconductor multilayer film and the second spacer layer,
is set to be different from an integral multiple of $\lambda/(4n)$, where $\lambda$ represents an oscillation wavelength and n represents the refractive index of the semiconductor layer.

7. A method for producing a surface-emitting semiconductor laser device, the method comprising:
forming a first semiconductor multilayer film of a first conductivity type on a substrate;
forming a first spacer layer having a first optical thickness on the first semiconductor multilayer film;
forming an active layer on the first spacer;
forming a second spacer layer having a second optical thickness on the active layer, the second optical thickness being different from the first optical thickness, and
forming a second semiconductor multilayer film of a second conductivity type on the second spacer, the second semiconductor multilayer film forming a cavity together with the first semiconductor multilayer film,
wherein the cavity is configured to form a pattern of a standing wave,
wherein a closest peak to a center of the active layer, from among peaks of the pattern of the standing wave, is located at position different from the center of the active layer.

* * * * *